United States Patent
Sato et al.

(10) Patent No.: US 6,199,505 B1
(45) Date of Patent: Mar. 13, 2001

(54) PLASMA PROCESSING APPARATUS

(75) Inventors: Hisaaki Sato, Tokyo; Tsutomu Tsukada, Chiba-ken; Shigeru Mizuno, Kanagawa-ken; Nobuaki Tsuchiya, Tokyo, all of (JP)

(73) Assignee: Anelva Corporation, Fuchi (JP)

( * ) Notice: Subject to any disclaimer, the term of this patent is extended or adjusted under 35 U.S.C. 154(b) by 0 days.

(21) Appl. No.: 09/250,402

(22) Filed: Feb. 16, 1999

(30) Foreign Application Priority Data

Apr. 8, 1998 (JP) .................................................. 10-111401

(51) Int. Cl.$^7$ ................................................. C23C 16/509
(52) U.S. Cl. ................................. 118/723 E; 118/723 R; 118/723 I; 156/345; 156/643; 315/111.21
(58) Field of Search ....................... 315/111.21; 156/345, 156/643; 118/723 E; 204/298

(56) References Cited

U.S. PATENT DOCUMENTS

| | | | |
|---|---|---|---|
| 4,131,533 | * 12/1978 | Bialko et al. | 204/298 |
| 5,210,466 | 5/1993 | Collins et al. | 315/111.21 |
| 5,401,356 | * 3/1995 | Enami et al. | 156/643 |
| 5,452,510 | * 9/1995 | Barnes et al. | 29/825 |
| 5,535,507 | * 7/1996 | Barnes et al. | 299/825 |
| 5,688,358 | * 11/1997 | Tanaka et al. | 156/345 |

OTHER PUBLICATIONS

W. Schwarzenbach, "Sheath impedance effects in very high frequency plasma experiments", J.Vac.Sci. Technol. A14(1), pp. 132–138, Jan./Feb. 1996.*

M.A. Sobolewski, "Electrical control of the spacial uniformity of reactive species in plasmas",J.Vac. Sci. Technol. A 17(6), pp. 3281–3292, Nov./Dec. 1999.*

R. Maggiora, "A self–consistent, integral equation technique for the analysis of ICRF antennas", AIP Conference Proceedings 403(1) pp. 421–424, Apr. 1, 1997.*

Y.L.Ho et al, "Self–Consistent 3–D ICRH antenna modeling with plasma", AIP Conference Proceedings 289(1) pp. 359–362, Oct. 15, 1994.*

P.Bletzinger. "Experimental characteristics of rf parallel plate discharges: Influence of attaching gases", Journal of Applied Physics 67(1) pp. 130–138.*

K.A. Olsen et al, "Characterization, modeling, and design of an electrostatic chuck with improved wafer temperature uniformity", Review of Scientific Instruments 66(2) pp. 1108–1114, Feb. 1996.*

S. Ramo et al., "Fields and Waves in Modern Radio", Second Edition, John Wiley & Sons, Inc., pp. 395–400, 1953.

* cited by examiner

*Primary Examiner*—Gregory Mills
*Assistant Examiner*—Rudy Zervigon
(74) *Attorney, Agent, or Firm*—Burns, Doane, Swecker & Mathis, LLP

(57) ABSTRACT

A plasma processing apparatus includes a cathode 54 having a large diameter part 56 and a long thin small diameter part 58, and the upper end surface of the large diameter part 56 faces the plasma forming space 76. The substrate 66 which is to be processed is mounted on the upper end surface of the large diameter part 56. The lower end of the small diameter part 58 is connected via the matching circuit 60 to the high frequency power source 62. The transmission path within the chamber comprises a large diameter coaxial line, a small diameter coaxial line and a radial line which connects them. The large diameter coaxial line includes the large diameter part 56, the first side wall 42 and the insulator 70. The radial line includes the lower surface of the large diameter part 56, the upper surface of the bottom plate 46 and the gap 72 between them. The small diameter coaxial line includes the small diameter part 58, the second side wall 68 and the gap 74. Appropriate impedance matching is achieved between the two coaxial lines and the radial line.

8 Claims, 7 Drawing Sheets

PLASMA PROCESSING APPARATUS

BACKGROUND OF THE INVENTION

CROSS-REFERENCE TO RELATED APPLICATION

This application claims the priority of Japanese Patent Application No. 10-111401, filed on Apr. 8, 1998, the contents of which are hereby incorporated herein by reference.

1. Field of the Invention

The invention concerns apparatus in which CVD (chemical vapor deposition) or etching, for example, is executed using plasma, and in particular it concerns plasma processing apparatus which is characterized by the construction of the transmission path by which the high frequency power is supplied to the plasma.

2. Discussion of Related Art

Surface processing such as CVD and etching is carried out widely using plasma at the present time, and LSI (large scale integrated circuits) and FPD (flat panel devices) are being manufactured using such techniques. Various systems are known for generating the plasma, but the plasma generating systems in which a high frequency discharge is used are widely employed because they enable a stable plasma to be obtained over a wide area. Plasma generating systems in which a high frequency discharge is used can be broadly classified into the capacitively coupled type systems and the inductively coupled type systems, and the invention of this present application concerns primarily plasma generation systems of the capacitively coupled type.

Plasma generating apparatus of the capacitively coupled type which is suitable for use with high frequencies (in the VHF/UHF band) has been disclosed in the specification of U.S. Pat. No. 5,210,466. A front cross sectional drawing of such conventional plasma processing apparatus is shown in FIG. 7 of the present application. The vacuum chamber 10 is constructed from a cylindrical side wall 12, a top-plate 14 and the bottom-plate 16. The cylindrical cathode 18 is present in the middle of the interior of the vacuum chamber 10, and is surrounded via the insulator 20 by the annular conductor 22. Thus, the transmission path inside the chamber comprises the cathode 18, the insulator 20 and the annular conductor 22. The vacuum chamber 10 is pumped out with the pumping apparatus 34. The discharge gas is delivered into the vacuum chamber 10 at an appropriate mass flow rate through the gas distribution plate 32 of the gas delivery apparatus and maintained at the prescribed pressure. High frequency energy from the high frequency power supply 26 is conducted into the abovementioned transmission path 24 within the vacuum chamber via the matching circuit 28 and plasma is generated between the cathode 18 and the anode (principally the gas distribution plate 32). Thus, in an etching process, for example, the etching is achieved by the action of the ions in the plasma on the substrate 36 on the cathode 18.

By adopting a transmission path of the type described above, the plasma processing apparatus shown in FIG. 7 enables a plasma to be generated at high frequencies of from 50 to 800 MHZ. The electrode sheath voltage is reduced by using such a high frequency and electrical damage to the substrate is minimized, and deposition rates or etch rates which are adequate for industrial purposes can be attained.

In the conventional apparatus shown in FIG. 7, the transmission path 24 within the chamber is a single coaxial line, and this coaxial line has been designed along the following lines. If the characteristic impedance of the coaxial line is $Z_0$, its length is L and the phase constant is $\beta$, then the input impedance $Z_{in}$ as seen from the matching circuit 28 of a coaxial line with a plasma providing a load impedance $(Z_L)$ is given by the following equation (1):

$$Z_{in}=Z_0[Z_L+jZ_0 \tan(\beta L)]/[Z_0+jZ_L \tan(\beta L)] \quad (1)$$

It is clear from this equation that when $Z_0=Z_L$, then $Z_{in}=Z_0$ irrespective of L. That is to say, by establishing a coaxial line which has a characteristic impedance $Z_0$ which is equal to the plasma impedance $Z_L$, the impedance of the coaxial line as seen by the matching circuit 28 has a constant value (equal to the plasma impedance), and the matching conditions are ideal. However, in practice the plasma impedance varies depending on the state of the plasma and it has a certain width, and so the characteristic impedance $Z_0$ of the coaxial line is set roughly to the mid-value of the width of this variation. In this case, rigorously, $Z_0$ is not equal to $Z_L$ and the line length L has an effect, and the matching conditions of the matching circuit become poor. It is necessary to make the line length L much shorter than a quarter wavelength to minimize this extent of this effect.

In the conventional apparatus shown in FIG. 7 of the '466 patent, the transmission path 24 within the chamber is a coaxial line with the cathode 18 as the internal conductor and the annular conductor 22 as the external conductor. The substrate 30 must be located on the cathode 18 and so the diameter of the cathode 18 must always be larger than the diameter of the substrate. The annular conductor 22 is on the outside of the cathode 18 and the outer wall 12 is on the outside of this. With apparatus which has such a construction the external dimensions of the outer wall 12 of the vacuum chamber become very large as the substrates become larger, and the weight of the apparatus is increased. As a result of the latest technical developments, a need for the size of the wafers which are being used for LSI to be increased to a diameter of 300 mm has arisen. Furthermore, in the case of FPD there is a need for an increase in the size of the glass substrates to 550×650 mm or to 1 meter square. Hence, the diameter of the cathode 18 has to be increased and, as a result, the weight of the apparatus is increased and there is a further problem in that the manufacturing costs are also increased.

OBJECTS AND SUMMARY

An aim of the invention is to provide plasma processing apparatus with which the weight of the apparatus is not much increased even if the size of the substrates is increased.

A further aim of the invention is to provide comparatively small, low-cost plasma processing apparatus in which the high frequency energy is coupled effectively to the plasma.

A plasma processing apparatus of the present invention makes use of high frequency power of from 30 to 300 MHZ (the VHF band) and is distinguished by the construction of the transmission path within the chamber. The transmission path within the chamber in this invention comprises a first coaxial line, a second coaxial line which has a smaller diameter than the first coaxial line and a radial line which is connected to the first coaxial line and the second coaxial line. Here, the "radial line" which is connected to the two coaxial lines, which are of different diameters signifies a transmission path in which the high frequency power is propagated not in the axial direction but in the radial direction.

The vacuum chamber walls are used for both the external conductor of the first coaxial line and the external conductor of the second coaxial line. The end surface of the first coaxial line faces the plasma forming space and the second coaxial line is connected to the aforementioned matching circuit. The high frequency power which is output from a high frequency power source is transmitted sequentially by the matching circuit, the second coaxial line, the radial line and the first coaxial line and supplied to the plasma. The substrate which is to be processed is located on the end surface of the first coaxial line which faces the plasma (or the end surface of the opposed electrode which faces the plasma).

The transmission path within the chamber should be impedance matched between the various structural parts. First of all, fundamentally, the design is such that the characteristic impedance of the first coaxial line is more or less equal to the plasma impedance. From this point of view, in this invention the characteristic impedance at the outer end of the radial line is preferably set within the range from about 0.5 to 2.0 times the characteristic impedance of the first coaxial line, and the characteristic impedance of the second coaxial line is preferably set within the range from about 0.5 to 2.0 times the characteristic impedance at the inner end of the radial line. Moreover, the transmission path is preferably designed in such a way that the total phase change when electromagnetic waves are passed through the transmission path within the chamber is preferably within the range from about 0 to 40 degrees.

The radial line is typically constructed by arranging a pair of parallel disk-like conductor surfaces facing one another, wherein the gap spacing is preferably constant. On the other hand, the gap spacing of the radial line may vary in the radial direction. That is to say, the radial line may be constructed by providing a disk-like first conductor and second conductor surface which has the form of a truncated conical surface opposing the first conductor surface, with these surfaces set in such a way that the spacing between the first conductor and the second conductor widens from the outside to the inside of the radial line. In this case, the angle subtended between the first conductor surface and the second conductor surface in the transverse cross section of the radial line is preferably within the range from 0 to 30 degrees. If the gap spacing on the inside is made wider than that on the outside in this way, the characteristic impedance at the inner end part of the radial line is raised, and the characteristic impedance of the second coaxial line can be raised as well and the gap between the conductors of the second coaxial line which has a small diameter can be widened.

In this invention, the first coaxial line and the second coaxial line are generally cylindrical and the radial line generally has the form of parallel disks. However, the cross sectional shapes of the first coaxial line and the second coaxial line may be shapes other than circular. They may be rectangular, for example.

The invention can also be applied to dual frequency plasma processing apparatus. For example, high frequency power in the range from the MF band (from 0.3 to 3 MHZ) to the HF band (from 3 to 30 MHZ) may be supplied to one of the opposed electrodes and high frequency power in the VHF band (from 30 to 300 MHZ) may be supplied to the other electrode. In this case the transmissions paths within the chamber for each opposed electrode are constructed by connecting coaxial lines of different diameters with radial lines.

Plasma processing apparatus of this invention is constructed by connecting two coaxial lines of different diameters with a radial line to form the transmission path within the chamber when using high frequency power of from 30 to 300 MHZ, and so when compared with the conventional technology where the transmission path within the chamber is formed with a single coaxial line, the external dimensions of the apparatus are reduced and the weight of the apparatus is also reduced. Furthermore, when such a transmission path is adopted, impedance matching of an extent where there are no practical problems can be achieved by setting the characteristic impedance at the outer end of the radial line within the range of from 0.5 to 2.0 times the characteristic impedance of the first coaxial line and the characteristic impedance of the second coaxial line within the range from 0.5 to 2.0 times the characteristic impedance at the inner end of the radial line.

DETAILED DESCRIPTION OF THE PREFERRED EMBODIMENTS

Figure 1:
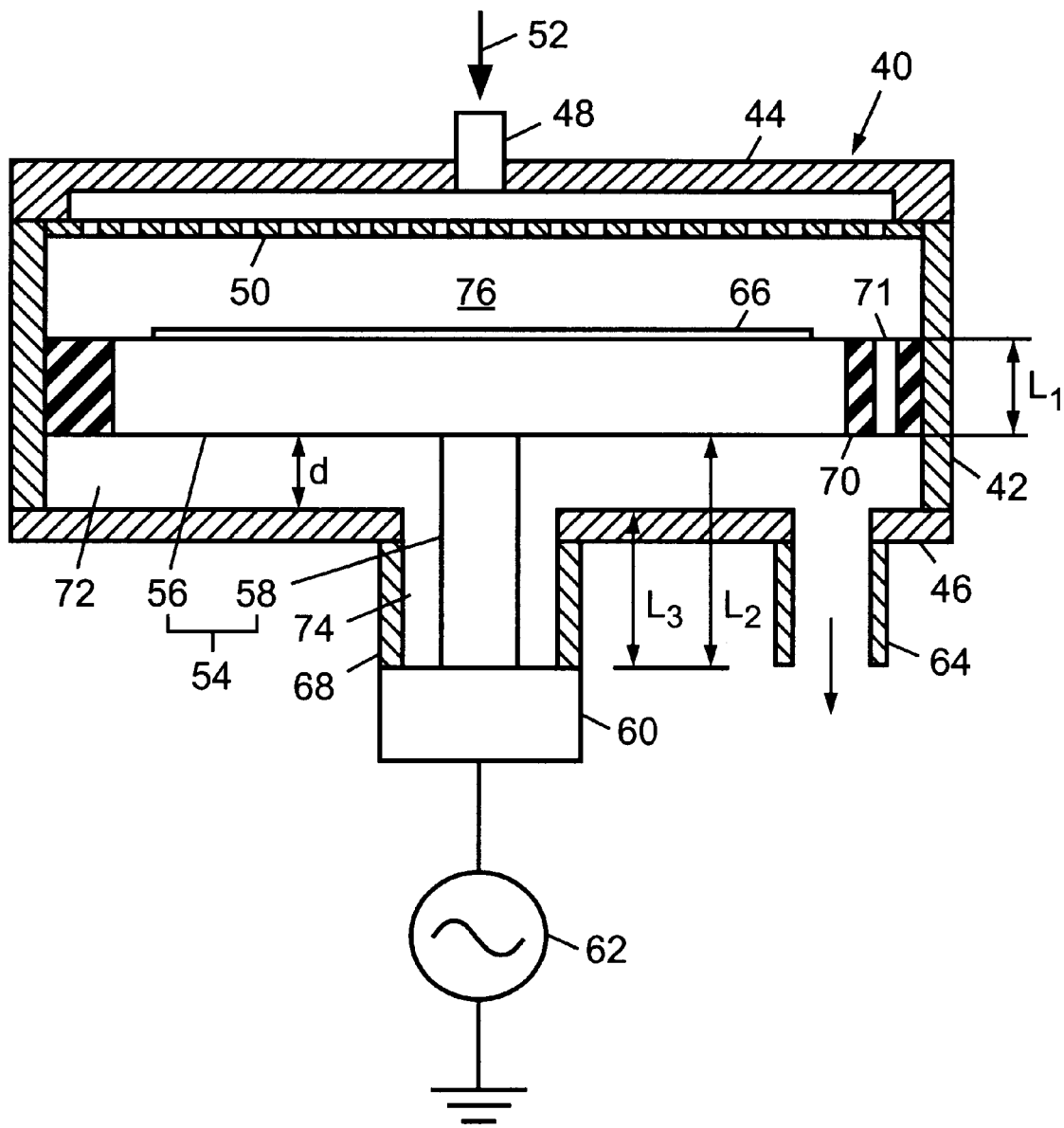
FIG. 1 is a front cross sectional view of a first embodiment of the invention.

A front cross sectional drawing of a first embodiment of the invention is shown in FIG. 1. The vacuum chamber 40 comprises a cylindrical first side wall 42, a circular top-plate 44, and a circular bottom-plate 46. Moreover, a second cylindrical side wall 68 which has a much smaller diameter than the first side wall 42 is established protruding downward from the middle of the bottom plate 46. A gas delivery apparatus 48 is established in the top plate 44, and a discharge gas 52 is blown out from a gas distribution plate 50. The vacuum chamber 40 is pumped out by a pumping apparatus 64.

A cathode 54 is present in the middle of the interior of the vacuum chamber 40. The cathode 54 comprises a short large diameter cylindrical rod-like part 56 of diameter $D_1$ and length $L_1$, which functions as the platform for the substrates. The cathode 54 further includes and a long and thin small diameter part 58 of diameter $D_2$ and length $L_2$, and these parts are formed as a single unit. The upper end surface of the large diameter part 56 faces a plasma generating space 76. A substrate 66 which is to be plasma processed is mounted on the upper end surface of the large diameter part 56. The lower end of the small diameter part 58 is connected via a matching circuit 60 to a high frequency power source 62. The cylindrical second wall 68 surrounds the lower part of the small diameter part 58.

The transmission path within the chamber comprises two coaxial lines which have different diameters and a radial line which connects them. The large diameter first coaxial part (hereinafter referred to as the large diameter coaxial line) is formed by the large diameter part 56 of the cathode 54, the first side wall 42 of the vacuum chamber 40 and an insulator 70 which is arranged between them. The length of the large diameter coaxial line is $L_1$. A through-hole 71 for pumping out purposes is formed in the insulator 70. The radial line is formed by the lower surface of the large diameter part 56 of the cathode 54, the upper surface of the bottom plate 46 and the gap 72 (gap spacing d) between them. This radial line has the form of a hollow disk comprised of flat parallel plates which are facing one another. The high frequency energy is transmitted in the radial direction in part of this radial line. The small diameter second coaxial line (hereinafter referred to as the small diameter coaxial line) comprises the small diameter part 58 of the cathode 54, the second side wall 68 of the vacuum chamber 40 and the gap 74 between them. The length $L_3$ of the second coaxial line is equal to ($L_2$–d). Moreover, when designing the transmission path, $L_1$+(d/2) is preferably taken as the effective length for the length of the large diameter coaxial line and $L_3$+(d/2) is preferably taken as the effective length for the length of the small diameter coaxial line.

The way in which the plasma apparatus is used is described below, taking the case where the plasma processing apparatus shown in FIG. 1 is being used as etching apparatus as an example. The substrate 66 is mounted on the upper end surface of the large diameter part 56 of the cathode 54. The vacuum chamber 40 is pumped out with the pumping apparatus 64. The discharge gas 52 is delivered from the gas distribution plate 50 of the gas delivery apparatus 48 and the interior of the vacuum chamber 40 is maintained at the prescribed pressure by adjusting the mass flow rate appropriately. High frequency energy in the VHF band (from 30 to 300 MHZ) is supplied from the high frequency power source 62, via the matching circuit 60, to the transmission path within the chamber. A high frequency electric field is induced in the space between the cathode 54 and the anode (principally the gas distribution plate 50), and plasma is generated. The ions in the plasma act on the substrate 66 and etching is achieved.

The transmission path within the chamber shown in FIG. 1 comprises three transmission parts as described above, and the way in which each transmission path is designed is of importance in terms of the effective coupling of the high frequency energy to the plasma. This point is described in detail below.

The impedance matching conditions of the large diameter coaxial line and the load are described first of all. The large diameter coaxial line has characteristic impedance $Z_{01}$, a transmission length of $L_1$ and a phase constant of $\beta$, and the plasma provides the load $Z_L$ (plasma impedance) of the large diameter coaxial line. Thus, the input impedance $Z_L$ of the large diameter coaxial line is given by equation (2) below.

$$Z_1 = Z_{01}[Z_L + jZ_{01}\tan(\beta L_1)]/[Z_{01} + jZ_L \tan(\beta L_1)] \quad (2)$$

Under typical etching conditions, the plasma impedance $Z_L$ seen from the transmission line can be represented by a series RC circuit and the resistance R at this time is roughly from 1 to 30 $\Omega$ and the capacity C is within the range from 50 to 400 pF. The characteristic impedance $Z_{01}$ of the large diameter coaxial line is set, for example, to 10 $\Omega$ so as to be more or less equal to the impedance of this series RC circuit.

As is clear from equation (2) above, $Z_1 = Z_{01}$ irrespective of $L_1$ when $Z_{01} = Z_L$. That is to say, by designing a large diameter coaxial line which has a characteristic impedance $Z_{01}$ which is equal to the plasma impedance $Z_L$, the input impedance of the large diameter coaxial part as seen from the radial line becomes more or less equal to the characteristic impedance $Z_{01}$ of the large diameter coaxial line. Here the transmission length $L_1$ of the large diameter coaxial line is set to a very short value and so even if the relationship $Z_{01} = Z_L$ is not always satisfied, when the relationship is close to this the relationship $Z_1 = Z_{01}$ holds approximately. That is to say, the relationship should be $Z_{01} = (0.5 \text{ to } 2.0)Z_L$, and preferably $Z_{01} = (0.8 \text{ to } 1.2)Z_L$. Even under these conditions the relationship $Z_1 = Z_{01}$ holds approximately. That is to say, the input impedance of the large diameter coaxial line becomes equal to its characteristic impedance (being constant irrespective of the length of the large diameter coaxial line length) and the matching conditions become ideal.

Next, the impedance matching conditions for the radial line and the load are investigated. The input impedance $Z_1$ of the large diameter coaxial line is the load of the radial line, and the input electromagnetic field impedance $Z_{fi}$ of the radial line seen from the small diameter coaxial line part is given by equation (3) below. Here, the input impedance $Z_1$ of the large diameter coaxial line converted to electromagnetic field impedance is used for $Z_{fL}$ (the radial line load) in this equation (this is explained hereinafter):

$$Z_{fi} = Z_{0i}[Z_{fL}\cos(\theta i - \psi_L) + jZ_{OL}\sin(\theta_i - \theta_L)]/[Z_{OL}\cos(\psi_i - \theta_L) + jZ_{fL}\sin(\psi_i - \psi_L)] \quad (3)$$

Figure 2:
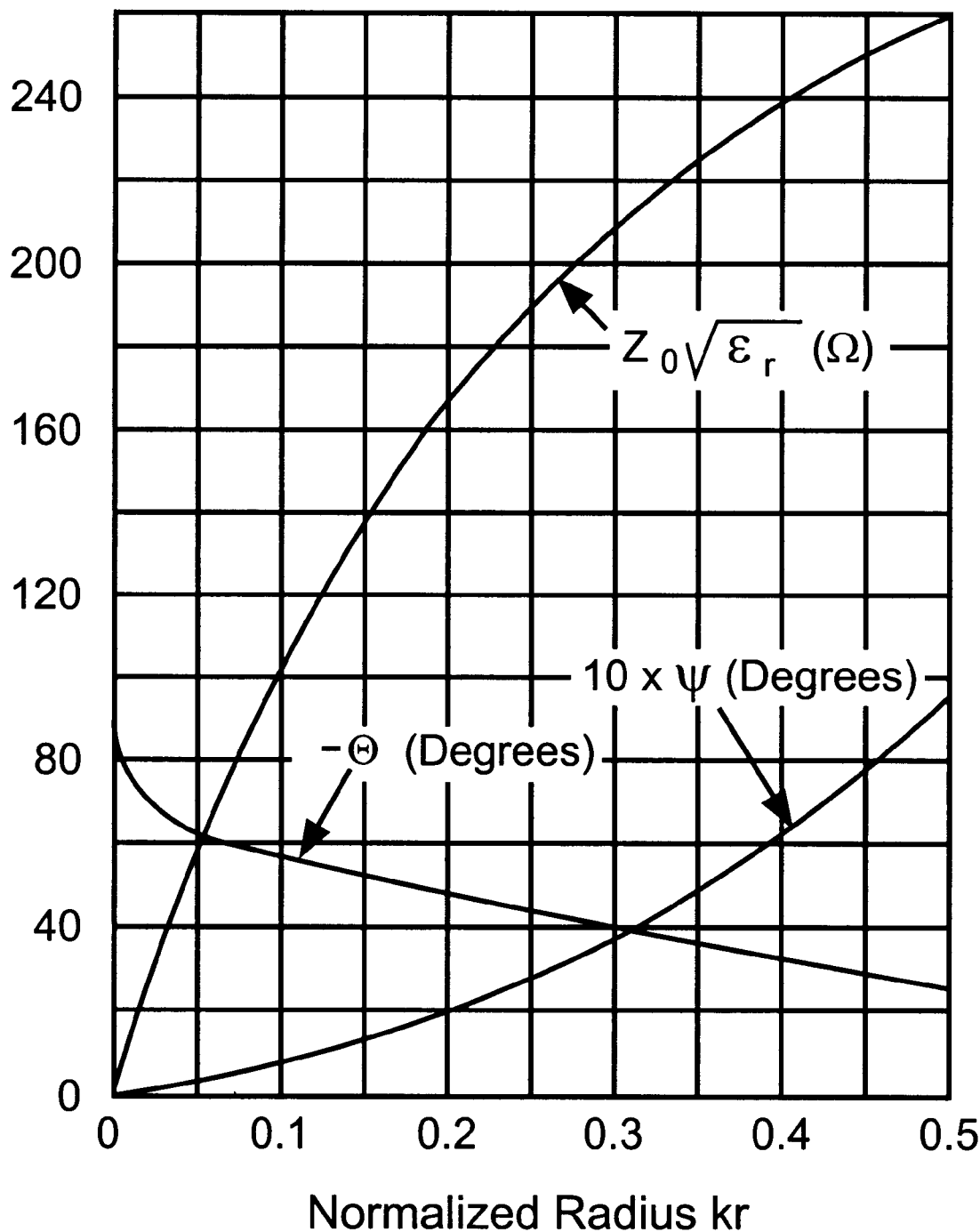
FIG. 2 is a graph which shows the relationships of the characteristic impedance and phase of the radial line and the normalized radius.

Here $Z_{0i}$ and $Z_{0L}$ are the characteristic field impedances at the input site and the load site of the radial line, $\theta_i$ and $\theta_L$ are the phases of the axial electric field at the input site and the load site of the radial line, and $\psi_i$ and $\psi_L$ are the phases of the circumferential magnetic field at the input site and the load site of the radial line. These characteristic field impedances and phases change according to the distance r from the center of the radial line which has the shape of a parallel disk. The changes are shown in FIG. 2. The abscissa in FIG. 2 is the normalized radius kr. Moreover, k is the radial phase constant of the radial line and k=$(\omega/c)\in_r^{1/2}$, wherein $\omega$ is the angular frequency and c is the speed of light. Here $\in_r$ is the relative dielectric constant of the insulator from which the gap 72 is formed and, since the material of the gap is a vacuum, $\in_r$ can be put equal to 1.0 (which is to say that k=$(\omega/c)$).

The field impedance $Z_f$ in the radial line is defined as the ratio of the axial electric field $E_z$ and the circumferential magnetic field $H_\theta$, $Z_f = E_z/H_\theta$. Furthermore, the relationships of equation (4) or (5) below exist between the field impedance $Z_f$ and the ordinary impedance $Z_t$ (total impedance) defined by the ratio of the voltage and the current.

When $r_i > r_L$:

$$Z_t = [d/(2\pi r)]Z_f \quad (4)$$

When $r_i < r_L$:

$$Z_t = -[d/(2\pi r)]Z_f \quad (5)$$

Here $r_i$ is the radius of the input site of the radial line, $r_L$ is the radius of the load site of the radial line, d is the gap spacing of the gap 72 shown in FIG. 1, and r is the distance from the center of the radial line.

When designing the radial line, the characteristic impedance at the outer end of the radial line is set equal to the characteristic impedance of the large diameter coaxial line and, moreover, the characteristic impedance at the inner end of the radial line is set equal to the characteristic impedance of the small diameter coaxial line. This is done to achieve impedance matching in the connecting part of the radial line and the large diameter coaxial line and the connecting part between the radial line and the small diameter coaxial line.

In this design process, the abovementioned calculations are carried out while varying the gap spacing d of the radial line and the optimum d value is determined for the plasma processing apparatus. The characteristic impedance at the outer end of the radial line is ideally more or less equal to the characteristic impedance of the large diameter coaxial line, but in practice other design conditions must also be taken into consideration and the characteristic impedance at the outer end of the radial line is set so as to be from 0.5 to 2.0 times (and preferably from 0.8 to 1.2 times) the characteristic impedance of the large diameter coaxial line. Similarly, the characteristic impedance at the inner end of the radial line is ideally more or less equal to the characteristic impedance of the small diameter coaxial line, but in practice other design conditions must also be taken into consideration and the characteristic impedance at the inner end of the radial line is set so as to be from 0.5 to 2.0 times (and preferably from 0.8 to 1.2 times) the characteristic impedance of the small diameter coaxial line.

The impedance matching of the impedances of the large diameter coaxial line and the small diameter line at the outer and inner ends of the radial line has been carried out using means such as that indicated above, but there are cases where this alone is inadequate. In these cases, minimizing as far as possible the extent of the total phase change when electromagnetic waves are passing through the transmission path within the chamber (the small diameter coaxial line, the radial line and the large diameter coaxial line) from the matching circuit to the plasma and minimizing the change of the impedance is effective. From a practical point of view, if the transmission length is set in such a way that the total phase change is within the range from 0 to 40 degrees, the change of the impedance is so small that it gives rise to no problem in practice. The total phase change can be determined using equation (6):

[Total Phase Change]=A[Phase Change of the Large Diameter Coaxial Line]+B[Phase Change of the Radial Line]+C[Phase Change of the Small Diameter Coaxial Line]   (6)

Here:

$A=(\omega/c)\in_r^{1/2}(180/\pi)$(degrees)

B=The change within the radial line (from the inner end to the outer end) of θ of FIG. 2 (degrees)

$C=(\omega/c)L_3(180/\pi)$(degrees)

$L_1$ and $L_3$ are the lengths of the large diameter coaxial line and small diameter coaxial line.

$\in_r$ is the relative dielectric constant of the insulator.

ω is the angular frequency, and c is the velocity of light.

The input impedance of the small diameter coaxial line is changed to the characteristic impedance 50 Ω of an ordinary coaxial cable by the matching circuit 60 and is connected on the high frequency power source side.

With such a design, the impedances of the large diameter coaxial line, the radial line and the small diameter coaxial line are maintained in a roughly matched condition and the high frequency energy is coupled effectively with the plasma.

Figure 3:
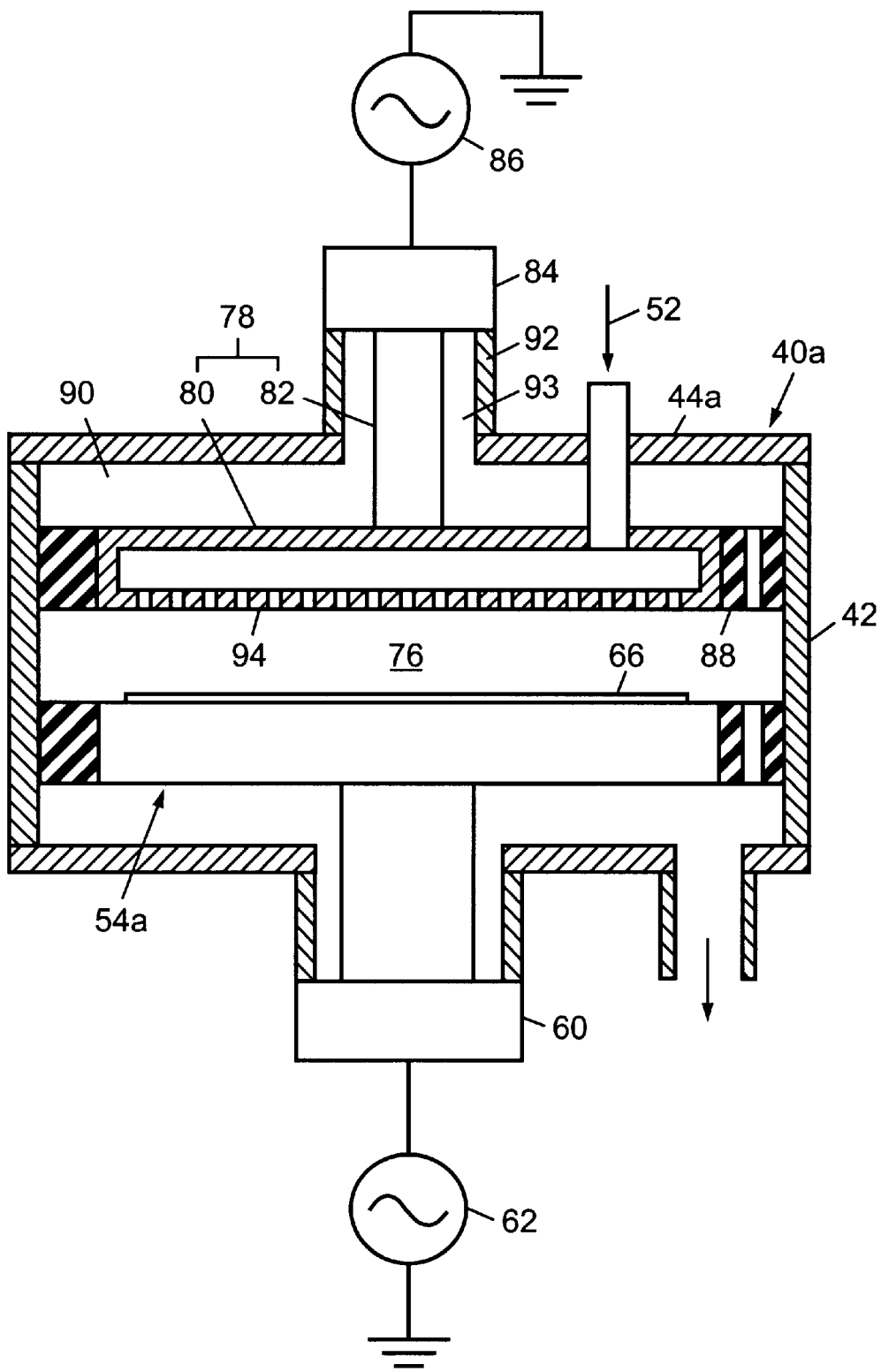
FIG. 3 is a front cross sectional view of a second embodiment of the invention.

A front cross sectional view of a second embodiment of the invention is shown in FIG. 3. This second embodiment resolves a problem of the plasma processing apparatus shown in FIG. 1 (the fact that independent control of the plasma density and the ion energy is impossible). The second embodiment differs from the first embodiment in that high frequency power is also applied to the upper electrode. The basic construction of the lower electrode 54a is the same as that in the first embodiment (although the frequency used is different and so the dimensions of the lower electrode are different from those in the first embodiment) and so it is not described here.

In FIG. 3, an upper electrode 78 is arranged within the vacuum chamber 40a in such a way that it faces the lower electrode 54a. The upper electrode 78 is similar to the lower electrode 54a and comprises a large diameter part 80 and a long thin small diameter part 82. A high frequency power source 86 is connected to the small diameter part 82 via a matching circuit 84. The transmission path within the chamber on the upper electrode 78 side also comprises three parts. That is to say, a large diameter coaxial line is formed by the large diameter part, the first side wall 42 and the insulator 88 which is between them, a radial line is formed by the upper surface of the large diameter part 80, the lower surface of the top plate 44a and the gap 90 between the two, and a small diameter coaxial line is formed by the small diameter part 82, the third side wall 92 and the gap 93 between them. The third side wall 92 has a cylindrical form of a much smaller diameter than the first side wall 42, and it protrudes upward from the middle of the top-plate 44a.

Impedance matching is also devised for the transmission path within the chamber on the upper electrode 78 side using the same means as described in the first embodiment above.

The interior of the large diameter part 80 of the upper electrode 78 forms a pathway for the discharge gas 52, and the discharge gas 52 is blown out from the gas distribution plate 94.

When etching a substrate 66 with this plasma processing apparatus, it provides apparatus of the so-called dual-frequency RIE (reactive ion etching) type. In this case, energy from the MF band (0.3 to 3 MHZ) to the HF band (3 to 30 MHZ) for biasing purposes is applied from a first high frequency power source 62 via a matching circuit 60 to the lower electrode 54a. On the other hand, energy in the VHF band (30 to 300 MHZ) for plasma generating purposes is applied from a second high frequency power source 86 via a matching circuit 84 to the upper electrode 78. By this means a high frequency electric field is induced between the upper and lower electrodes, the gas is ionized and plasma is generated in the plasma generating space 76. The energy of the ions in the plasma (the acceleration energy with respect to the substrate 66) is controlled by the first high frequency power source 62 (the bias side power source), and the plasma density is controlled by the second high frequency power source 86. That is to say, the ion energy and the plasma density can be controlled independently.

Figure 4:
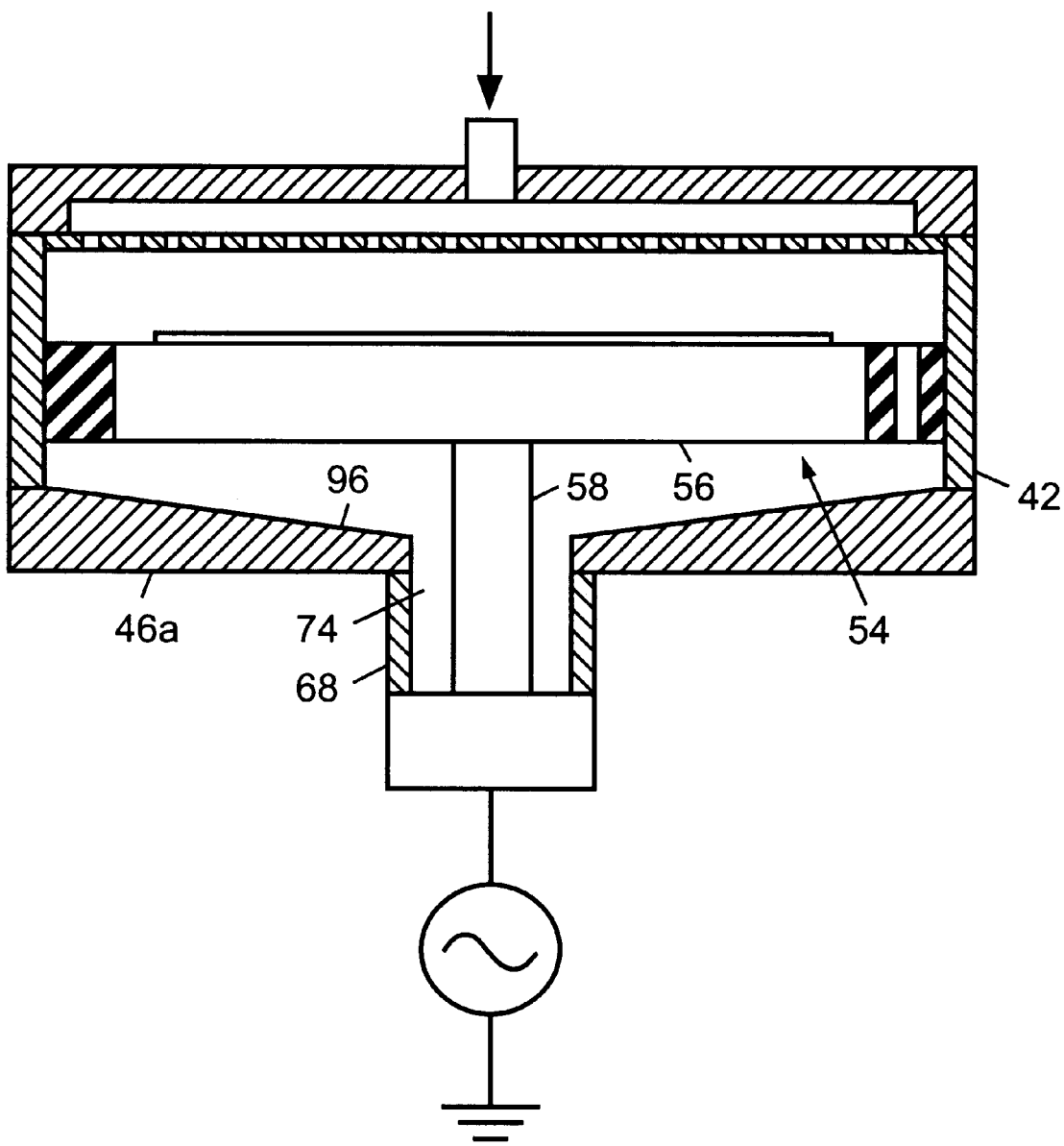
FIG. 4 is a front cross sectional view of a third embodiment of the invention.

A front cross sectional view of a third embodiment of the invention is shown in FIG. 4. The construction of the radial line in the first embodiment has been changed in this embodiment. That is to say, in FIG. 4 the upper surface of the bottom-plate 46a is inclined so as to form a truncated conical surface, and this is a difference from the embodiment shown in FIG. 1. The remaining structure is the same as in the embodiment shown in FIG. 1.

In FIG. 4, the upper surface 96 of the bottom-plate 46a is a downwardly convex truncated conical surface, and its transverse cross sectional form is that of a straight line which is inclined downward toward the center. The angle of inclination with respect to the bottom surface (the horizontal surface) of the large diameter part 56 of the cathode electrode 54 is within the range from about 0 to 30 degrees. With such a construction, the radial line which is formed by the lower surface of the large diameter part 56 of the cathode 54 and the upper surface 96 of the bottom-plate 46a is such that the gap spacing becomes wider toward the center. That is to say, this radial line is such that the impedance value increases towards the inside. Consequently, the characteristic impedance value of the small diameter coaxial line which should be impedance matched at the inner end part of the radial line can also be raised. If the characteristic impedance value of the small diameter coaxial line can be raised, then the gap 74 between the small diameter part 58 and the second wall 68 can be widened and the power withstand resistance of the coaxial line is improved and, at the same time, matching with a power source side cable which has a characteristic impedance of 50 Ω is also facilitated.

The plasma processing apparatus of the invention has been described above with examples of etching apparatus, but with just the same electrode structure the invention can also be applied to plasma enhanced CVD apparatus.

Furthermore, the invention can be used not only with substrates which are essentially circular wafers but also with rectangular substrates (FPD substrates) such as those measuring 550 mm×650 mm. Moreover, in those cases where the transverse cross section of the cathode electrode and the vacuum chamber is roughly rectangular for a rectangular substrate, the rectangular shape should be converted to a circular shape of the same area for use in the various equations described above.

A method of determining impedance is described below. In this invention, the transmission path within the chamber comprises three elements (large diameter coaxial line, radial line and small diameter coaxial line), and the provision of impedance matching between these elements is important. A method of calculating the characteristic impedance of each element is described below.

Figure 5A:
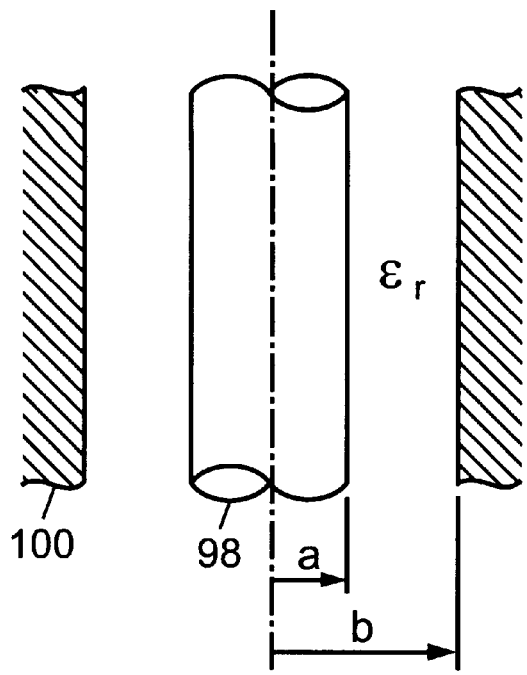
FIGS. 5(A) and 5(B) are explanatory diagrams for describing the method of calculating the characteristic impedance.

The characteristic impedance of the coaxial lines is calculated in the following way. Thus if, in FIG. 5(A), the radius of the outer circumferential surface of the round rod-like inner conductor 98 is a, the radius of the inner circumferential surface of the hollow cylindrical outer conductor 100 is b and the dielectric constant of the insulator between the two is $\in_r$, then the characteristic impedance $Z_0$ of the coaxial line comprising the inner conductor 98 and the outer conductor 100 can be obtained using equation (7):

$$Z_0 = (60/\in_r{}^{1/2})\ln(b/a) \quad (7)$$

In equation (7) above, the relative dielectric constant $\in_r$ is determined by the material of the dielectric and is essentially independent of the frequency and so the characteristic impedance of the coaxial line is independent of the frequency.

The phase constant β of a coaxial line can be obtained using equation (8):

$$\beta = (2\pi f/c)\in_r{}^{1/2} \quad (8)$$

where f is the frequency.

Figure 5B:
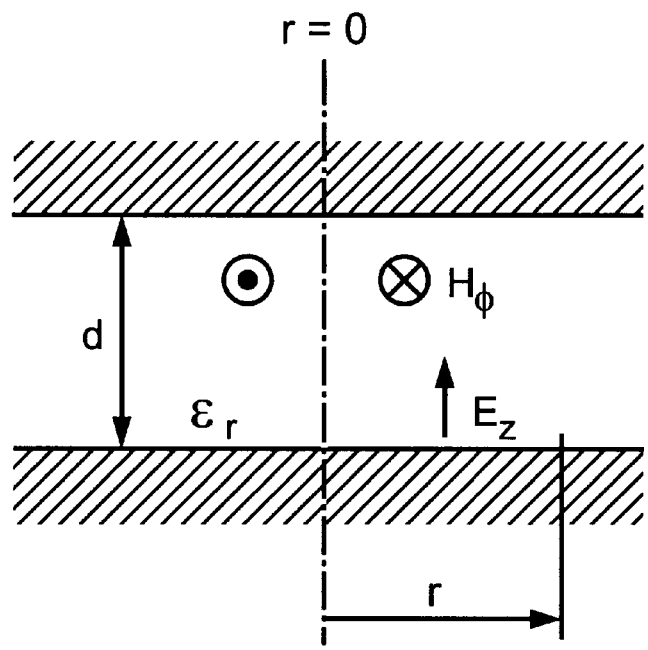

The characteristic impedance of a radial line is calculated in the following way. Thus if, in FIG. 5(B), the gap spacing between the parallel plates is d and the relative dielectric constant of the insulator is $\in$, then the characteristic field impedance $Z_f$ for any radius r is defined by the ratio of the axial electric field $E_z$ and the circumferential magnetic field $H_\theta$ and it can be obtained using the following equation (9):

$$Z_f(kr) = E_z/H\phi = (377/\in_r{}^{1/2})[G_0(kr)]/[G_1(kr)] \quad (9)$$

Where:

$G_0(x) = [J_0{}^2(x) + N_0{}^2(x)]^{1/2}$ $G_1(x) = [J_1{}^2(x) + N_1{}^2(x)]^{1/2}$ $J_0(x)$ and $J_1(x)$ are first kind Bessel functions $N_0(x)$ and $N_1(x)$ are second kind Bessel functions $k = (\omega/c)\in_r{}^{1/2} = (2\pi f/c)\in_r{}^{1/2}$ Equation (4) above should be used to calculate the field impedance $Z_f$ and the ordinary impedance $Z_r$. As is clear from equation (9), the radial line characteristic field impedance depends on the radius and the frequency since the radial phase constant k depends on the frequency f.

ILLUSTRATIVE EXAMPLE

Figure 6:
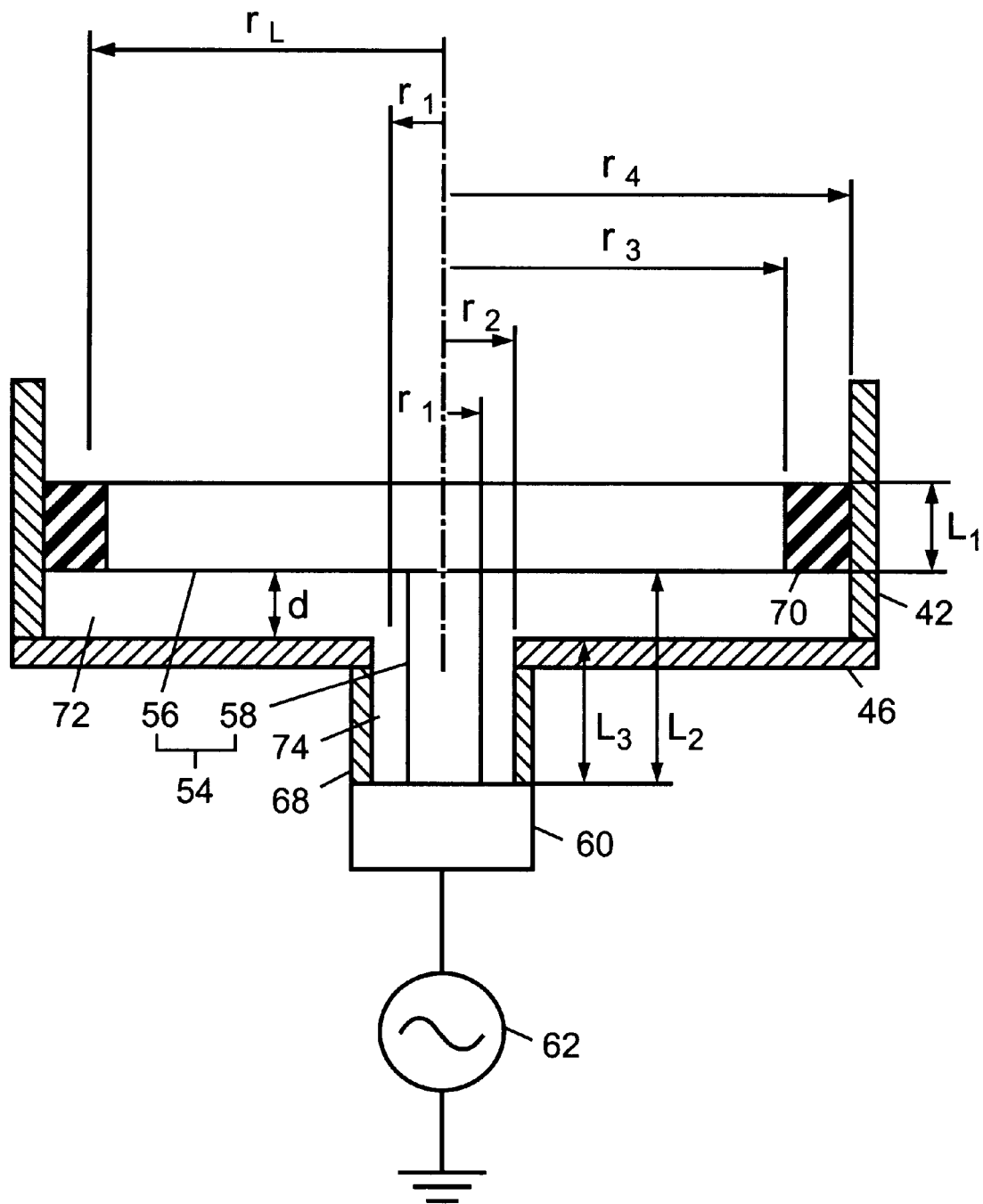
FIG. 6 is a front cross sectional view for describing an example of the design of the plasma processing apparatus shown in FIG. 1.
Figure 7:
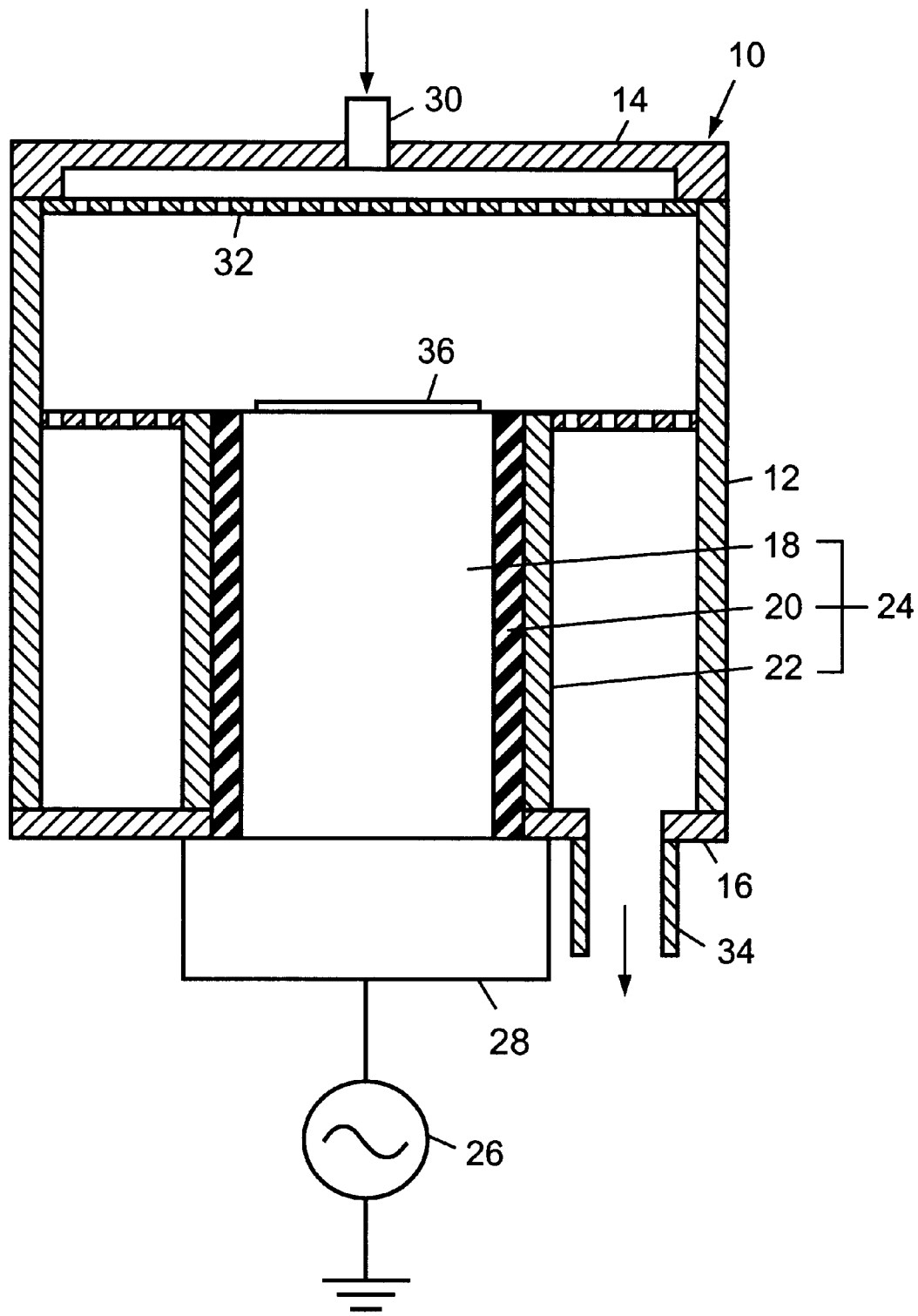
FIG. 7 is a front cross sectional view of conventional plasma processing apparatus.

An example of the design of plasma processing apparatus as shown in FIG. 1 is described below with reference to FIG. 6. The design of plasma processing apparatus for processing 8 inch wafers using a VHF band frequency of 60 MHZ is described as an example below. The radius of the outer circumferential surface of the small diameter part 58 of the cathode 54 is $r_1$, the radius of the inner circumferential surface of the second wall 68 is $r_2$, the radius of the outer circumferential surface of the large diameter part 56 of the cathode 54 is $r_3$ and the radius of the inner circumferential surface of the first wall 42 is $r_4$. Quartz (relative dielectric constant $\in_r$ –3.78) is used for the insulator 70.

First of all, assume that the diameter of the large diameter part 56 of the cathode 54 (the part on which the substrate is mounted) is 280 mm ($r_3 = 140$ mm), the length $L_1$ of the large diameter part 56 is 60 mm and the length $L_3$ of the part surrounded by the second wall 68 of the small diameter part 58 is 50 mm.

The radius $r_4$ of the inner circumferential surface of the first wall 42 is set first of all to determine the characteristic impedance $Z_{01}$ of the large diameter coaxial line. The impedance of the plasma at a frequency of 60 MHZ is about 10 Ω. This forms the large diameter coaxial line load. Ideally, the characteristic impedance $Z_{01}$ of the large diameter coaxial line should be equal to the load impedance $Z_L$ (10 Ω), but here the design is such that $Z_{01}$ is about 8 Ω (0.8 times $Z_L$). The characteristic impedance $Z_{01}$ of the large diameter coaxial line can be calculated using equation (7). If the values $Z_{01} = 8$ Ω, dielectric constant $\in_r = 3.78$ and $a = r_3 = 140$ mm are substituted into equation (7) then $b = r_4 = 180$ mm is obtained. According to this, the radial direction thickness of the insulator 70 ($r_4 - r_3$) is 40 mm. This is equal to the gap spacing $G_1$ of the large diameter coaxial line.

Next, the input impedance $Z_1$ of the large diameter coaxial line (the impedance as seen at the radial line) is calculated. The input impedance $Z_1$ of the large diameter coaxial line can be calculated using equation (2). Substituting the values $Z_L = 10$ Ω, $Z_{01} = 8$ Ω and $\beta_1 = 2.44$ rad/m ($\beta_1$ can be calculated using equation (8) above) are substituted into equation (2) and the length (85 mm) obtained by adding half the gap spacing d (25 mm) to the length $L_1$ (60 mm) of the large diameter coaxial line is substituted for $L_1$. As a result, a value of $Z_1 = 9.81$ Ω which is approximately equal to 10 Ω is obtained. This is the radial line load.

Next, the radial line is designed in such a way that the characteristic impedance at the outer end of the radial line is equal to the characteristic impedance (8 Ω) of the large diameter coaxial line. The radius $r_L$ of the load end (outer end) of the radial line is $r_L = (r_3 + r_4)/2 = 160$ mm. If this is multiplied by the radial phase constant k and converted to a normalized radius then it becomes $kr_L = 0.200$ rad. If this value is taken on the abscissa of the graph shown in FIG. 2 then the values of $Z_{0L} = 165$ Ω, $\theta_L = -47$ degrees $\psi_L = 1.7$ degrees are obtained. The characteristic field impedance $Z_{0L}$ at the outer end of the radial line has been obtained as 165 Ω in this way and so this is converted to the ordinary characteristic impedance $Z_{0oL}$. That is to say, using equation (4) above, $Z_{Oot}=[d/(2\pi r_L)]Z_{OL}$. Then, if this characteristic impedance is put equal to the characteristic impedance of the large diameter coaxial line (8 Ω), then $Z_{Oot}=[d/(2\pi r_L)]Z_{OL}=[d/(2\pi\times160)]\times165=8$. Solving this for the gap d, a value of d=49 mm is obtained. Thus, the design value for the gap length d is set to 50 mm.

On the other hand, $r_1$ and $r_2$ are not fixed for the radius $r_i=(r_1+r_2)/2$ of the input end (inner end) of the radial line, but here with $r_1$ and $r_2$ not being fixed, the average value $r_i$ is just assumed to be $r_i=22.5$ mm. This is multiplied by the radial phase constant k and converted to a normalized radius and $kr_i=0.028$ rad is obtained. If this value is taken on the abscissa of the graph in FIG. 2, then values of $Z_{0i}=45$ Ω, $\theta i=-68$ degrees and $\psi_i=0.0$ degree are obtained. In this way, 45 Ω is obtained for the characteristic field impedance $Z_{0i}$ at the inner end of the radial line and so this is converted to the ordinary characteristic impedance $Z_{0it}$. That is to say, using equation (4) above, $Z_{0it}=[d/(2\pi r_i)]Z_{0i}=[50/(2\pi\times22.5)]\times45=16$ Ω.

Next, the characteristic impedance $Z_{02}$ of the small diameter coaxial line is fixed, and this is fixed fundamentally in such a way that it is equal to the characteristic impedance $Z_{0it}$ at the inner end of the radial line. However, in consideration of other design elements, it is designed so as to be 1.5 times $Z_{0it}$ (16 Ω) (which is to say 24 Ω). Using equation (7) as described above in connection with the characteristic impedance of a coaxial line, $Z_{02}=24=(60/\epsilon_r^{1/2})\ln(r_2/r_1)$, and if the relative dielectric constant $\epsilon_r$ of the gap (air) in the coaxial line is 1 then $r_2r_1=1.47$. By solving simultaneously both this relationship and the fact that $r_i=(r_1+r_2)/2=22.5$ mm as mentioned above, values of $r_1=18.2$ mm and $r_2=26.8$ mm are obtained. Hence, the gap spacing $G_2$ of the small diameter coaxial line is $G_2=(r_2-r_1)=8.6$ mm.

Next, the total phase change of the transmission path within the chamber is obtained. The phase change A of the large diameter coaxial line is $A=\beta_1(L_1+d/2)(180/\pi)=11.9$ degrees. The phase change B of the radial line is $B=\Delta\theta=(\theta_L-\theta_1)$ 21 degrees. The phase change C of the small diameter coaxial line is $C=\beta_2(L_3+d/2)(180/\pi)=5.4$ degrees. Hence, the total phase change is the sum of these values, 38.3 degrees. There is no problem in practice with transformation of the impedance since the total phase change is within the range from 0 to 40 degrees.

The results of the design as described above are summarized in Table 1 and Table 2 below. Table 1 is principally a summary of the physical dimensions. Table 2 is principally a summary table of the numerical values of the impedances and phases.

Although only preferred embodiments are specifically illustrated and described herein, it will be appreciated that many modifications and variations of the present invention are possible in light of the above teachings and within the purview of the appended claims without departing from the spirit and intended scope of the invention.

TABLE 1

| | |
|---|---|
| Diameter of the large diameter part 56 of the cathode 54 | $2r_3$ = 280 mm |
| Length of the large diameter part 56 of the cathode 54 | $L_1$ = 60 mm |
| Effective length of the large diameter coaxial line | $L_1 + d/2$ = 85 mm |
| Material of the insulator 70 | Quartz |
| Relative dielectric constant of the insulator 70 | $\epsilon_r$ = 3.78 |
| Gap spacing of the large diameter coaxial line | $G_1$ = 40 mm |
| Gap spacing of the radial line | d = 50 mm |
| Diameter of the small diameter part 58 of the cathode 54 | $2r_1$ = 36.4 mm |
| Length of the small diameter part 58 of the cathode 54 | $L_2$ = 100 mm |
| Length of the small diameter coaxial line | $L_3$ = 50 mm |
| Effective length of the small diameter coaxial line | $L_3 + d/2$ = 75 mm |
| Gap spacing of the small diameter coaxial line | $G_2$ = 8.6 mm |

TABLE 2

| | |
|---|---|
| Plasma impedance | $Z_L$ = About 10 Ω |
| Characteristic impedance of the large diameter coaxial line | $Z_{O1}$ = 8 Ω |
| Input impedance of the large diameter coaxial line | $Z_1$ = About 10 Ω |
| Phase constant of the large diameter coaxial line | $\beta_1$ = 2.44 rad/m |
| Characteristic field impedance at the input end (inner end) of the radial line | $Z_{0i}$ = 45 Ω |
| Characteristic field impedance at the load end (outer end) of the radial line | $Z_{0L}$ = 165 Ω |
| Phase of the axial electric field at the input site (inner end) of the radial line | $\Theta_i$ = −68 degrees |
| Phase of the axial electric field at the load site (outer end) of the radial line | $\Theta_L$ = −47 degrees |
| Phase of the circumferential magnetic field at the input site (inner end) of the radial line | $\psi_i$ = 0 degree |
| Phase of the circumferential magnetic field at the load site (outer end) of the radial line | $\psi_L$ = 1.7 degrees |
| Radial phase constant of the radial line | k = 1.26 rad/m |
| Characteristic impedance of the small diameter coaxial line | $Z_{02}$ = 24 Ω |
| Phase constant of the small diameter coaxial line | $\beta_2$ = 1.26 rad/m |
| Total phase change | 38.3 degrees |

What is claimed is:

1. A plasma processing apparatus, comprising:
a vacuum chamber;
a pumping apparatus with which the vacuum chamber can be pumped out;
a gas delivery apparatus which delivers a discharge gas into the vacuum chamber;
a high frequency power source which supplies high frequency power in the range from 30 to 300 MHz;
a transmission path within the vacuum chamber which transmits the high frequency power inside the vacuum chamber;
a matching circuit which is established between the high frequency power source and the transmission path within the vacuum chamber;
wherein:
the transmission path within the vacuum chamber comprises a first coaxial line having an end surface and an outer conductor, a second coaxial line which has an outer conductor and a diameter smaller than that of the first coaxial line, and a radial line which is connected to the first coaxial line and the second coaxial line, the radial line having an outer end part and an inner end part;

the vacuum chamber is also used as the outer conductor of the first coaxial line and as the outer conductor of the second coaxial line;

the end surface of the first coaxial line faces a plasma generating space; and the second coaxial line is connected to the matching circuit, wherein the characteristic impedance at the outer end part of the radial line is within the range from 0.5 to 2.0 times the characteristic impedance of the first coaxial line, and the characteristic impedance of the second coaxial line is within the range from 0.5 to 2.0 times the characteristic impedance at the inner end part of the radial line.

2. A plasma processing apparatus, comprising:

a vacuum chamber;

a pumping apparatus with which the vacuum chamber can be pumped out;

a gas delivery apparatus which delivers a discharge gas into the vacuum chamber;

a high frequency power source which supplies high frequency power in the range from 30 to 300 MHZ;

a transmission path within the vacuum chamber which transmits the high frequency power inside the vacuum chamber;

a matching circuit which is established between the high frequency power source and the transmission path within the vacuum chamber;

wherein:

the transmission path within the vacuum chamber comprises a first coaxial line having an end surface and an outer conductor, a second coaxial line which has an outer conductor and a diameter smaller than that of the first coaxial line, and a radial line which is connected to the first coaxial line and the second coaxial line, the radial line having an outer end part and an inner end part;

the vacuum chamber is also used as the outer conductor of the first coaxial line and as the outer conductor of the second coaxial line;

the end surface of the first coaxial line faces a plasma generating space;

the second coaxial line is connected to the matching circuit; and wherein the characteristic impedance at the outer end part of the radial line is within the range from 0.8 to 1.2 times the characteristic impedance of the first coaxial line, and the characteristic impedance of the second coaxial line is within the range from 0.8 to 1.2 times the characteristic impedance at the inner end part of the radial line.

3. The plasma processing apparatus of claim 1, wherein the total phase change when electromagnetic waves are passed through the transmission line within the chamber is within the range from 0 to 40 degrees.

4. The plasma processing apparatus of claim 2, wherein the total phase change when electromagnetic waves are passed through the transmission line within the chamber is within the range from 0 to 40 degrees.

5. The plasma processing apparatus of claim 1, wherein the radial line includes a pair of disc-shaped conductor surfaces which oppose one another in parallel.

6. The plasma processing apparatus of claim 1, wherein the radial line includes a disc-shaped first conductor surface and a second conductor surface which has a truncated conical surface form which opposes the first conductor surface, and the spacing between the first conductor surface and the second conductor surface widens from the outside to the middle of the radial line.

7. The plasma processing apparatus of claim 6, wherein the angle subtended between the first conductor surface and the second conductor surface in the transverse cross sectional form of the radial line is within the range from 0 to 30 degrees.

8. A plasma processing apparatus, comprising:

a vacuum chamber;

a pumping apparatus with which the vacuum chamber can be pumped out;

a gas delivery apparatus which delivers discharge gas into the vacuum chamber;

a first high frequency power source which supplies high frequency power in the range from 0.3 to 30 MHZ;

a second high frequency power source which supplies high frequency power in the range from 30 to 300 MHZ;

a first transmission path within the vacuum chamber which transmits high frequency power from the first high frequency power source inside the vacuum chamber;

a second transmission path within the vacuum chamber which transmits high frequency power from the second high frequency power source inside the vacuum chamber;

a first matching circuit which is established between the first high frequency power source and the first transmission path within the vacuum chamber;

a second matching circuit which is established between the second high frequency power source and the second transmission path within the vacuum chamber;

wherein:

the first transmission path within the chamber comprises a first coaxial line having an outer conductor and an end surface, a second coaxial line having an outer conductor and which has a diameter smaller than that of the first coaxial line, and a first radial line which is connected to the first coaxial line and the second coaxial line;

the second transmission path within the chamber comprises a third coaxial line having an outer conductor and an end surface, a fourth coaxial line having an outer conductor and which has a diameter smaller than that of the third coaxial line, and a second radial line which is connected to the third coaxial line and the fourth coaxial line;

the vacuum chamber is also used as the outer conductor of the first coaxial line and as the outer conductor of the second coaxial line, and as the outer conductor of the third coaxial line and as the outer conductor of the fourth coaxial line;

the end surface of the first coaxial line faces a plasma generating space;

the second coaxial line is connected to the first matching circuit;

the end surface of the third coaxial line faces the plasma generating space;

the fourth coaxial line is connected to the second matching circuit; and wherein:

the characteristic impedance at the outer end part of the second radial line of the second transmission path is within the range from 0.5 to 2.0 times the characteristic impedance of the third coaxial line, and the characteristic impedance of the fourth coaxial line is within the range from 0.5 to 2.0 times the characteristic impedance at the inner end part of the second radial line.

* * * * *